United States Patent [19]
Mattisson

[11] Patent Number: 4,459,554
[45] Date of Patent: Jul. 10, 1984

[54] EQUALIZATION AMPLIFIER

[75] Inventor: Sven Mattisson, Bjarred, Sweden

[73] Assignee: Inventab Audio Kb, Luna, Sweden

[21] Appl. No.: 331,984

[22] Filed: Dec. 18, 1981

[51] Int. Cl.³ .............................................. H03F 1/00
[52] U.S. Cl. .................................. 330/107; 330/151; 330/304; 333/28 R; 360/65
[58] Field of Search .............. 330/304, 151, 126, 107, 330/294; 307/520; 328/167; 455/267; 179/1 D; 333/28 T, 28 R; 360/65, 67

[56] References Cited

U.S. PATENT DOCUMENTS 3,533,004 10/1970 Embley .............................. 330/125
4,293,819 10/1981 Shibayama et al. .................... 330/9

OTHER PUBLICATIONS

Operational Amplifiers, Burr-Brown, (McGraw-Hill, 1971), pp. 183-186.

Primary Examiner—James B. Mullins
Assistant Examiner—Steven J. Mottola
Attorney, Agent, or Firm—Yount & Tarolli

[57] ABSTRACT

An equalization amplifier (30) is disclosed which includes two amplifier stages (32, 34) connected in cascade. The first amplifier stage (32) includes a low pass filter amplifier (40) having a pole frequency of F1 and a feed forward path (36) bypassing the low pass filter amplifier. The feed forward path provides the input signal to an adder circuit (42) where it is added to the output of the low pass filter amplifier. The effect of this addition is to provide the first amplifier with a zero frequency of F2, where F2 is greater than F1. The resulting sum signal is applied to the second amplifier stage (34) which also has a low pass filter characteristic. The second filter has a pole frequency of F3, where F3 is greater than F2. The equalization amplifier is particularly useful for providing RIAA equalization of phono cartridge output signals.

9 Claims, 4 Drawing Figures

EQUALIZATION AMPLIFIER

BACKGROUND AND FIELD OF THE INVENTION

The present invention relates to an equalization amplifier, and more particularly provides an equalization amplifier such as may conveniently be used for providing RIAA equalization of an output signal provided by a phonographic turntable.

Equalization amplifiers are circuits having nonlinear transfer characteristics designed to compensate for an undesired amplitude-frequency or phase-frequency characteristic of a system. Equalization amplifiers are used, for example, in phonographic record playing systems since the amplitude-frequency characteristic of the signal provided by the transducers in such systems (i.e., the phono cartridge) is not the same as the amplitude-frequency characteristic of the audio signal from which the phonographic recording was originally derived. This is because the audio signal is deliberately treble boosted during recording in order to improve signal-to-noise ratio during playback of the phonographic record. Furthermore, the bass frequencies of the played-back signal are severly attenuated due to inherent limitations in the phonographic recording/playback process.

Phono equalization amplifiers are designed to have nonlinear transfer characteristics in accordance with standards established by the Record Industry Association of America (RIAA) in order to eliminate this distortion on playback. The RIAA nonlinear transfer characteristic is essentially a low pass structure which begins to roll-off at 50 Hz, flattens out at 500 Hz, and begins to roll-off again at 2.1 KHz. The roll-off frequencies of 50 Hz and 2.1 kHz are known as "pole" frequencies, whereas the frequency at which the characteristic flattens out (i.e. 500 Hz) is known as a "zero" frequency.

In order to provide high quality reproduction of signals derived from phonographic records, it is of course desirable that the RIAA equalization amplifier provide as low a level of distortion as possible. Present RIAA amplifiers include but a single amplifier having frequency responsive components associated with it for tailoring the transfer characteristic of the amplifier to RIAA specifications. The gains of such RIAA equalization amplifiers are generally limited in order to prevent stability problems from arising. This limited amplifier gain also leads to inadequate bass response and excessive distortion, however. It would be desirable if an equalization amplifier could be provided which avoided these problems.

SUMMARY OF THE INVENTION

An equalization amplifier is described herein which avoids the problems of the prior art by providing a feed forward amplifier in cascade with another amplifier, where the frequency responses of the two amplifiers combine to produce the total equalization characteristic desired.

More particularly, an equalization amplifier is provided for equalizing the frequency response of an input signal, where the equalization amplifier has a transfer characteristic exhibiting pole frequences of F1 and F3, and a zero frequency of F2, where F1 is smaller than F2, which in turn is smaller than F3. The equalization amplifier includes a first amplifier means having a first low-pass filter characteristic with a cutoff frequency of F1. The first amplifier means is responsive to the input signal to provide a first filtered output signal. Means are included for combining a signal corresponding to the input signal to the first filtered output signal so as to provide a sum signal, with that means combining the signals in such proportions that the transfer characteristics of the first amplifier means in combination with the adding means exhibits not only the pole frequency of F1 due to the first amplifier means, but also a zero frequency of F2 due to the combining means. Second amplifier means are provided having a second low-pass filter characteristic exhibiting a cutoff frequency of F3. The second amplifier means is responsive to the sum signal whereby the output signal provided by the second amplifier means has the desired form.

By splitting the frequency selection duties of the equalization amplifier between two individual amplifier stages connected in cascade, the constraints on each individual stage are reduced. It is therefore possible to provide an equalization amplifier characterized by low distortion and adequate gain at all frequencies.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

For any circuit, the output signal may be defined as:

$$V_o = V_{in} H(s) \tag{1}$$

where
$V_{in}$ is the applied input signal;
$H(s)$ is the transfer characteristic of the circuit; and
$V_o$ is the resulting output signal.

In accordance with RIAA standards, the transfer characteristic $H(s)$ of a phono equalization should be:

$$H = \frac{(1 + sT_1)A_o}{(1 + 10sT_1)(1 + sT_2)} \tag{2}$$

where
$T_1 = 318 \times 10^{-6}$
$T_2 = 75 \times 10^{-6}$
$A_o$ is an arbitrary gain constant
$s = j(2 f)$
and where
$j$ is the imaginary operator and
$f$ is the frequency of the applied input signal.
This transfer characteristic has a zero frequency of 500 Hz, and two pole frequencies of 50 Hz and 2.122 kHz. Consequently, the transfer characteristic has an amplitude which varies with frequency as illustrated in the graphical representation of FIG. 1(A). This transfer characteristic is essentially a low-pass structure which begins to roll off at six decibels per octave at the first pole frequency of 50 Hz, flattens out at the zero frequency of 500 Hz, and then begins to roll off once again at a six decibel per octave rate at the second pole frequency of 2.12 kHz.

Figure 2:
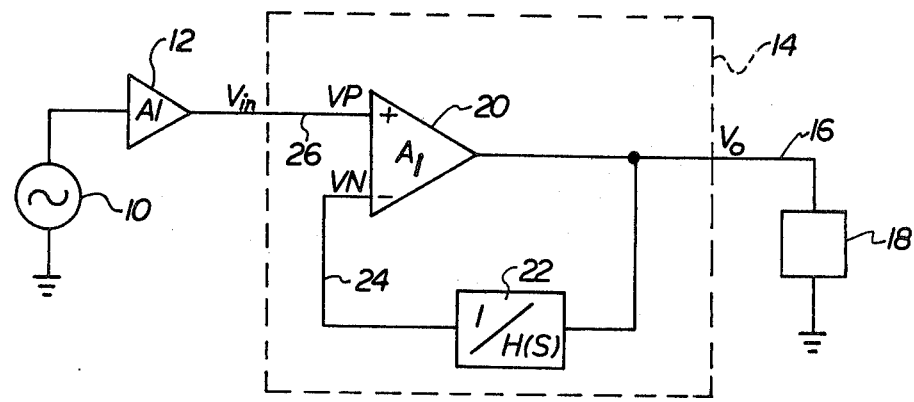
FIG. 2 is a schematic representation of a conventional differential amplifier arrangement.

RIAA equalization amplifiers often take the form shown in FIG. 2. In FIG. 2 the input signal is provided by a transducer 10 which is conventionally the cartridge associated with a phonographic turntable. The signal provided by the transducer 10 is conditioned by a pre-amplifier 12 which has input characteristics optimized to the transducer 10. The output signal of the amplifier 12 represents the input signal $V_{in}$ applied to the RIAA equalization amplifier 14. The equalization amplifier provides the equalized output signal $V_o$ on an output line 16, to which is connected a load 18. The load normally comprises a power amplifier, but can take other forms as well, of course.

In FIG. 2 the RIAA equalization amplifier 14 is shown as taking the conventional form of a differential amplifier 20 having a frequency dependent feedback circuit 22. The feedback circuit 22 is coupled from the output 16 of the differential amplifier 20 to its inverting input 24. The input signal $V_{in}$, on the other hand, is connected to the noninverting input 26 of the differential amplifier.

The differential amplifier 20 is characterized by a gain of $A_1$, and provides an output signal of the form:

$$V_o = (VP - VN)A_1 \tag{3}$$

where

VP is the input signal at the noninverting input terminal;

VN is the input signal at the inverting input terminal; and $A_1$ is the open loop gain of the amplifier.

In the specific circuit shown in FIG. 2 the input signal $V_{in}$ is applied to the noninverting input terminal 26, hence VP is equal to $V_{in}$. Also, the signal VN applied to the inverting input terminal 24 of the amplifier is equal to the output signal $V_o$ times the feedback ratio $(1/H(s))$. By substituting these into equation (3), we get:

$$V_o = [V_{in} - (V_o/H(s))]A_1 \tag{4}$$

This can be rewritten as:

$$\frac{V_o}{V_{in}} = A_1/[1 + (A_1/H(s))] = H'(s) \tag{5}$$

From equation (5) it follows that the actual transfer characteristic $H'(s)$ of the RIAA amplifier 14 is dependent not only upon the frequency dependency of the feedback circuit 22, but also upon the gain $A_1$ of the amplifier 20. Ideally the gain $A_1$ is extremely high such that $A_1/H(s)$ is much greater than one. The denominator of equation (5) may then be approximated as $A_1/H(s)$, and equation (5) simplifies to:

$$\frac{V_o}{V_{in}} = H'(s) = H(s) \tag{6}$$

Unfortunately, in practical amplifiers the gain $A_1$ is low enough that, for some feedback ratios, this simplification cannot be made with high accuracy. Even worse, the open loop gain term $A_1$ is frequency dependent due to the internal compensation of the differential amplifier being employed. Although operational amplifiers are available which lack this internal compensation, the unrestricted gain of such amplifiers introduces stability problems into the circuit. For this reason they are not used in a circuit such as this. Yet when internally compensated amplifiers are used, distortion is introduced by the finite and frequency dependent nature of their open loop gain.

To reduce distortion, the quotient $A_1/H(s)$ must be maximized. The greater this quotient is, the closer $H'(s)$ approaches $H(s)$. The gain $A_1$ is set by the amplifier and is thus unalterable. The only alternative is to increase the term $1/H(s)$, which equates to a reduction in the magnitude of the term $H(s)$. A reduction in the magnitude of this term, however, represents a reduction in the closed loop gain of the RIAA amplifier below desired levels, and hence represents an unsatisfactory solution.

In accordance with the present invention, the problems of the FIG. 2 circuitry are avoided by providing several amplifier stages connected in cascade, whereby the constraints on each of the individual amplifier stages may be reduced. More specifically, the quotient $A_1/H(s)$ for the individual amplifiers may be increased, making their frequency characteristics more independent of inherent amplifier gain/frequency dependencies than would be possible with the FIG. 2 circuitry. The reduced $H(s)$ necessary to produce this result is compensated for by the additional stage of gain in cascade with the first amplifier.

Figure 1:
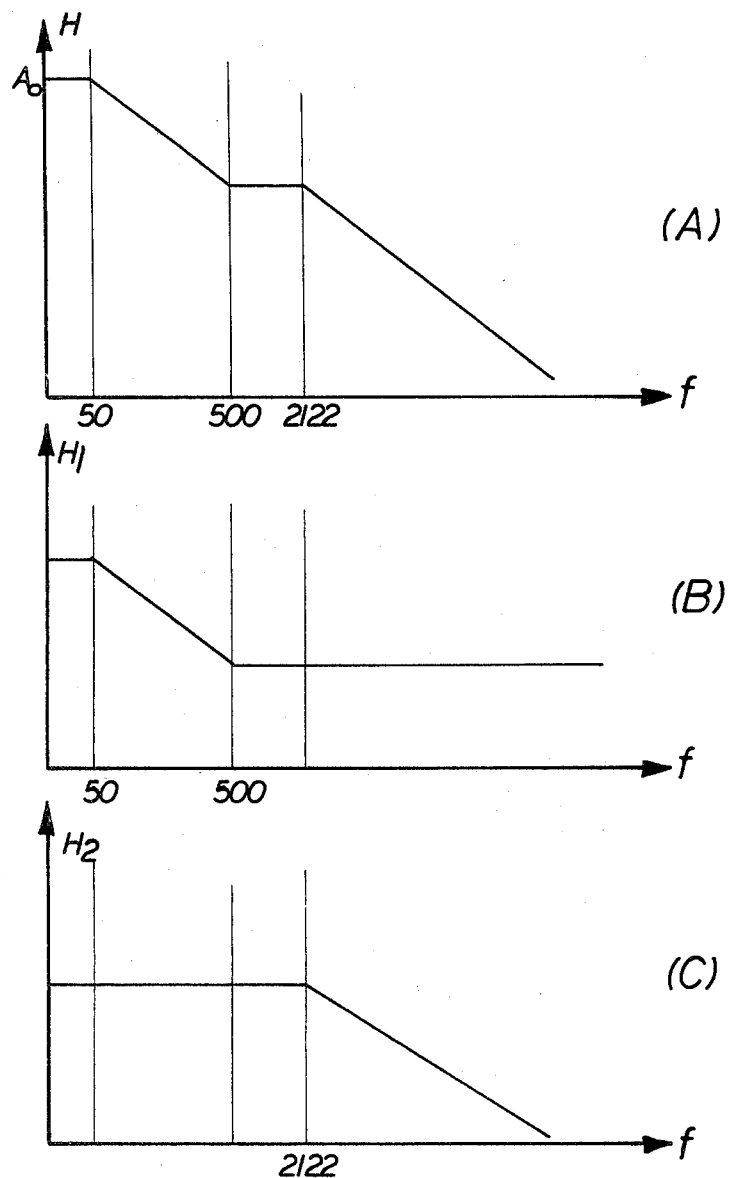
FIGS. 1(A)-(C) are graphical representations of the desired amplitude-frequency transfer characteristics of an RIAA equalization amplifier and of portions of the equalization amplifier in accordance with the present invention.

Since, as stated previously, the RIAA equalization characteristic of FIG. 1 rolls off at a six decibel per octave rate, only one stage of filtering can be rolling off at any given frequency. (If two stages of filtering were both rolling off at a given frequency, then the total roll off rate would be twice the desired rate, or 12 decibels per octave.) To provide the desired overall characteristic, the first amplifier is provided with a characteristic shown in FIG. 1(B). This transfer characteristic has a pole at 50 Hz and a zero at 500 Hz. The second amplifier is provided with a flat frequency response up to a pole frequency of 2.12 kHz, after which it rolls off at a six decibels per octave rate. The transfer characteristic of the cascade combination of amplifiers is the characteristic of FIG. 1(B) times the characteristic of FIG. 1(C). This product coincides with the frequency response characteristic of FIG. 1(A).

This same result may also be obtained mathematically by manipulation of the RIAA transfer characteristic of equation (2). Thus, equation (2) may be manipulated as follows:

$$H(s) = \frac{(10 + 10sT_1)}{(1 + 10sT_1)(1 + sT_2)} \frac{A_o}{10} \tag{7}$$

$$= \left[1 + \frac{9}{(1 + 10sT_1)}\right]\left[\frac{1}{(1 + sT_2)}\right]\left[\frac{A_o}{10}\right] \tag{8}$$

$$= H_1(s) H_2(s) \tag{9}$$

where $$H_1(s) = 1 + \frac{9}{(1 + 10sT_1)} \tag{10}$$

and $$H_2(s) = \left[\frac{1}{1+sT_2}\right]\left[\frac{A_o}{10}\right] \quad (11)$$

From this it follows that the total transfer characteristic H may be derived by providing two amplifiers in cascade, one having a transfer characteristic of $H_1$ (FIG. 1(B)) and the second having a characteristic of $H_2$ (FIG. 1(C)).

Figure 3:
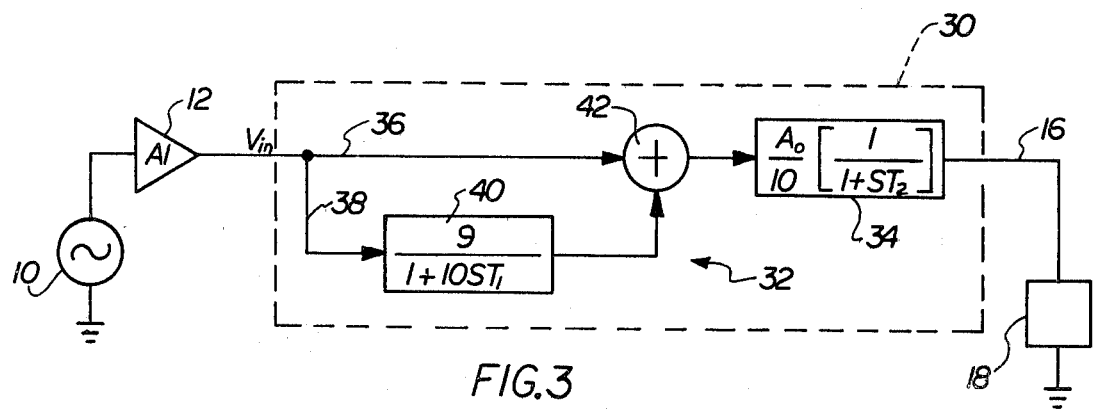
FIG. 3 is a block diagram of an RIAA equalization amplifier in accordance with the teachings of the present invention.

In FIG. 3 the single amplifier RIAA equalization circuit 14 of FIG. 2 is replaced by a different equalization amplifier arrangement 30 including two amplifier stages 32 and 34 connected in cascade with one another. The amplifier stage 32 is a feed forward amplifier having two channels 36 and 38, both of which are connected to the output of the pre-amplifier 12. The channel 38 includes an amplifier 40 having a transfer characteristic corresponding to the second term of equation (10). The other channel 36, however, comprises a feed forward path which provides no change in the input signal. The signal appearing on this line corresponds to the first term (i.e., unity) of the equation (10) transfer characteristic. The output of the amplifier 40 is added to the input signal in a summing circuit 42. The transfer characteristic of the amplifier stage 32 comprises the additive combination of the transfer characteristics of the two individual paths, and thus corresponds to the transfer characteristic $H_1$ described above in equation (10).

The output of the summing circuit 42 is directed to the input of the second amplifier stage 34. Amplifier 34 is a conventional low-pass filter amplifier having a pole frequency of approximately 2.12 kHz, whereby it has a transfer characteristic $H_2$ described by equation (11), above. The total transfer characteristic of these two cascaded amplifier stages 32 and 34 is the product of their individual transfer characteristics, which as stated above corresponds with the desired transfer characteristic of an RIAA equalization amplifier.

The circuitry of FIG. 3 exhibits a number of advantageous features. Since the feed forward path 36 of the feed forward amplifier 32 encounters no processing of any kind, it reaches the summing circuit 42 without distortion. For higher frequencies, where distortion may be expected to occur at the output of the amplifier 40, it is the signal provided along the feed forward path 36 which dominates, essentially minimizing the effect of that distortion. Moreover, since the gain of the output signal provided by the equalization amplifier 30 comprises the product of the gain of the two circuits, each circuit can be constructed to have a smaller closed loop gain than would otherwise be possible. The two amplifiers 40 and 34 which together make up the equalization amplifier 30 are therefore designed to have lower closed loop gains, which means that the quotient $A_1/H(s)$ is increased. Each amplifier, therefore exhibits reduced distortion.

Figure 4:
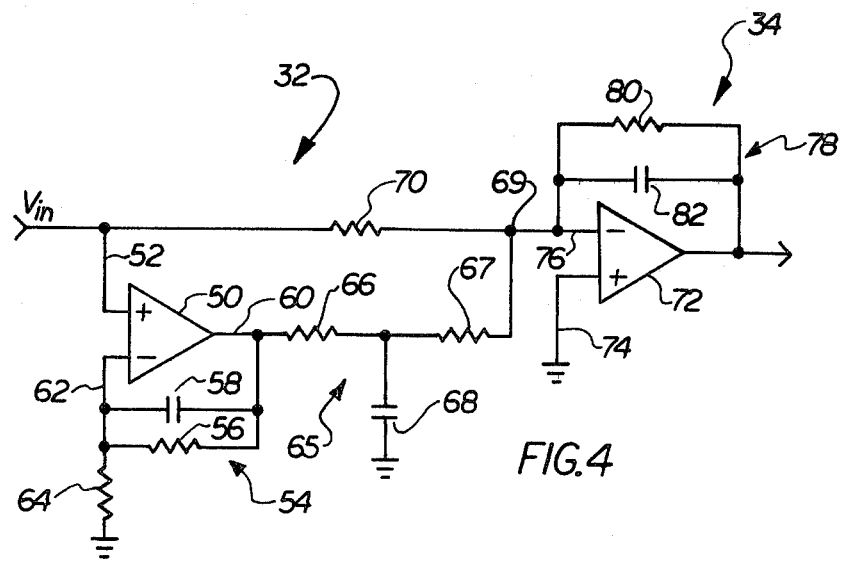
FIG. 4 is a more detailed circuit schematic of a portion of the circuitry of FIG. 3.

FIG. 4 illustrates one possible embodiment of the equalization amplifier 30 of FIG. 3. In FIG. 4, the amplifier 40 is shown as comprising an operational amplifier 50 having the input signal $V_{in}$ applied to its noninverting input 52. The amplifier 50 has a feedback circuit 54 including a resistor 56 and capacitor 58 connected in parallel between the output 60 of the amplifier 50 and its inverting input 62. The inverting input 62 is also connected to ground through an input resistor 64. The amplifier 50 operates as a low-pass filter having a turnover frequency dependent upon the values of resistors 56 and capacitor 58. For the RIAA equalization amplifier being described, the product of the values of resistors 56 and capacitor 58 will be equal to $10T_1$, or 3180 microseconds. The DC gain of the circuit is established by the ratio of resistors 56 and 64. Since resistor 64 has a value which is approximately one-eighth of the value of resistor 56, amplifier 50 has a D.C. gain of 9.

When configured as shown in FIG. 4, the amplifier 50 has the desired DC gain of 9 and roll-off frequency of 50 Hz. The gain reduction at higher frequencies is caused by reduction in the impedance of the feedback network, represented by capacitor 58 and resistor 56, at these frequencies. When the feedback impedance is lowest (i.e., zero) the amplifier output 60 is effectively shorted to its inverting input 62. The amplifier then operates as the unity gain buffer amplifier. Since the feedback impedance cannot drop below zero, the gain of the amplifier cannot fall below unity. Consequently, the frequency response characteristic of the amplifier flattens out at a gain of unity at some frequency above the turnover frequency of 50 Hz. In the example being described, wherein the amplifier 50 has a DC gain of 9, this flattening out occurs at a frequency nine times the turnover frequency of 50 Hz, i.e., at 450 Hz. Consequently, the transfer characteristic of the amplifier 50 exhibits a "zero" at a frequency of 450 Hz. This transfer characteristic corresponds to the one shown in FIG. 1(B), but with 450 Hz as the zero frequency.

The circuit response at frequencies above 500 Hz is intended to be provided by the feed forward path 70 rather than the amplifier 50. Consequently, an additional low-pass filter 65 is included to filter the output of amplifier 50 so as to remove those frequencies in excess of 500 Hz. As shown in FIG. 4, the low-pass filter 65 includes resistors 66 and 67 and a capacitor 68. The resistors 66 and 67 are connected in series between the output of amplifier 50 and a circuit node 69, whereas the capacitor 68 is connected between the common junction of the two resistors and ground. (Circuit node 69 is effectively at ground potential due to the operation of the feedback loop around amplifier 72.) The resistor and capacitor values are selected so that the low-pass filter 65 exhibits a pole frequency of 500 Hz, whereby the outputs thereof will roll-off at a six decibel per octave rate at frequencies in excess of 500 Hz. The amplifier 50 and low pass filter 65 then together provide the transfer characteristic indicated in block 40 of FIG. 3.

In FIG. 4 the feed forward path is represented by a resistor 70 connected between the input 52 and the common circuit node 69. The common node 69, in turn, is connected to the noninverting input 76 of the cascaded amplifier 34. In the example currently being described, this input resistor 70 has a value equal to the sum of resistors 66 and 67 whereby the input signal $V_{in}$ and the output of the amplifier 50 are added together in equal proportions.

In FIG. 4 the second amplifier 34 is shown as comprised of a second operational amplifier 72 having its noninverting input 74 connected to ground and its inverting input 76 connected to the common node 69 to which the resistors 67 and 70 are attached. The operational amplifier 72 is provided with a low-pass transfer characteristic by including a frequency dependent feedback network 78, again consisting of a parallel combination of resistor 80 and capacitor 82. The roll off frequency of the amplifier 34 is determined, again, by the product of the two components 80 and 82. For an RIAA equalization amplifier this product is equal to 75 microseconds whereby the output of circuit 72 will begin to roll off at approximately 2.12 kHz. This provides the second pole in the RIAA equalization characteristic. The total transfer characteristic of the FIG. 4 circuitry is as illustrated in FIG. 1(A).

Although the invention has been described with respect to a preferred embodiment, it will be appreciated that various rearrangements and alterations of parts may be made without departing from the spirit and scope of the present invention, as defined in the appended claims. Thus, although in the specific embodiment shown in FIG. 4, the amplifier 50 is connected in a noninverting arrangement, it could alternatively have been connected in an inverting arrangement. The output of the amplifier would then be subtracted from, rather than added to, the output of the feed-forward path. Amplifier 72, on the other hand, can be connected in either inverting or noninverting configurations, as desired. Furthermore, although the specific embodiment has been described as using operational amplifiers, any other type of amplifier could obviously be used. The order of the amplifier stages 32 and 34 could be reversed, with the output of stage 32 being directed to the input of stage 34 instead of vice versa. Many other alternative arrangements will of course be apparent to those skilled in the art.

What is claimed is:

1. Apparatus for providing RIAA equalization of the frequency response of an input signal, comprising:

first amplifier means including discrete frequency dependent impedance means having an impedance value selected to provide said amplifier means with a first low-pass filter characteristic with a cut-off frequency F1 on the order of 50 Hz, said first amplifier means being responsive to said input signal to provide a first filtered output signal;

a feed forward signal path responsive to said input signal to provide a feed forward signal corresponding to said input signal;

means for combining said feed forward signal with said first filtered output signal so as to provide a combined signal, said combining means combining said signals in such proportion that the combined transfer characteristic of said first amplifier means and said combining means flattens out at a frequency F2 on the order of 500 Hz; and second amplifier means including discrete frequency dependent impedance means having an impedance value selected to provide said amplifier means with a second low-pass filter characteristic with a cut-off frequency F3 on the order of 2.1 kHz, said second amplifier means being responsive to said combined signal whereby the output signal provided by said second amplifier means has the desired RIAA equalized output form.

2. Apparatus as set forth in claim 1, wherein said first amplifier means has a single pole at frequency F1 and has a DC gain which is nine times the DC gain in said feed forward signal path, and wherein said combiner means combines said first filtered output signal and said feed forward signal in equal proportions, whereby said frequency F2 at which said characteristic flattens out is one decade above said pole frequency F1.

3. Apparatus for providing RIAA equalization of the frequency response of an input signal, comprising first and second amplifier stages connected in cascade; wherein said first amplifier stage includes first amplifier means including discrete frequency dependent impedance means having an impedance value selected to provide said amplifier means with a first low-pass filter characteristic with a cut-off frequency of F1, said first amplifier means being responsive to said input signal to provide a first filtered output signal, a feed forward signal path responsive to said input signal to provide a feed forward signal corresponding to said input signal, and means for combining said feed forward signal with said first filtered output signal so as to provide a combined signal, said combining means combining said signals in such proportion that the combined transfer characteristic of said first amplifier means and said combining means flattens out at a frequency of F2; wherein said second amplifier stage includes second amplifier means including discrete frequency dependent impedance means having an impedance value selected to provide said amplifier means with a second low-pass filter characteristic with a cut-off frequency F3 which is greater than F2; and wherein said frequencies F1, F2, and F3 are such that said apparatus provides the desired RIAA equalization of said input signal.

4. Apparatus as set forth in claim 3, wherein said first amplifier means has a single pole at frequency F1 and has a DC gain which is nine times the DC gain in said feed forward signal path, and wherein said combiner means combines said first filtered output signal and said feed forward signal in equal proportions, whereby said frequency F2 at which said characteristic flattens out is one decade above said pole frequency F1.

5. Apparatus as set forth in claim 3 wherein said frequency F1 is 50 Hz, said frequency F2 is 500 Hz, and said frequency F3 is 2.1 kHz, and wherein said first and second low pass filter characteristics roll off at a rate of 6 db. per octave, whereby said apparatus has an RIAA transfer characteristic.

6. Apparatus as set forth in claim 3, wherein said first and second amplifier means comprise differential amplifiers having discrete frequency dependent feedback networks.

7. Apparatus as set forth in claim 6, wherein said combining means comprises impedance means connecting the outputs of said first amplifier means and said feed forward signal path to a common node, said node representing the output of said combining means.

8. Apparatus as set forth in claim 3, wherein said output of said combining means is connected to the input of said second amplifier means, whereby said first amplifier stage is connected ahead of said second amplifier stage.

9. Apparatus as set forth in claim 3, wherein said first amplifier means comprises a differential amplifier having an output and inverting and noninverting inputs, means for applying said input signal to said noninverting input, impedance means connecting said inverting input to a reference potential, at least one discrete frequency dependent inpedance element connected between said amplifier output and said inverting input, and a low pass filter connected between said amplifier output and said combining means, said low pass filter having a cut-off frequency approximately equal to the frequency at which the closed loop frequency response of said differential amplifier flattens out at unity gain.

* * * * *